United States Patent
Kim et al.

(10) Patent No.: US 10,268,603 B2
(45) Date of Patent: Apr. 23, 2019

(54) ELECTRONIC SYSTEM AND ELECTRONIC DEVICE CAPABLE OF CAPTURING HIGH SPEED SIGNAL

(71) Applicant: SK hynix Inc., Icheon-si, Gyeonggi-do (KR)

(72) Inventors: Hyung Kyu Kim, Icheon-si (KR); Il Hun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 195 days.

(21) Appl. No.: 15/184,471

(22) Filed: Jun. 16, 2016

(65) Prior Publication Data
US 2017/0124005 A1    May 4, 2017

(30) Foreign Application Priority Data
Oct. 29, 2015 (KR) .......................... 10-2015-0150661

(51) Int. Cl.
G06F 13/12    (2006.01)
G06F 13/16    (2006.01)
G06F 13/40    (2006.01)
G11C 5/04    (2006.01)

(52) U.S. Cl.
CPC .......... G06F 13/16 (2013.01); G06F 13/4068 (2013.01); G11C 5/04 (2013.01)

(58) Field of Classification Search
None
See application file for complete search history.

(56) References Cited

U.S. PATENT DOCUMENTS 5,337,413 A * 8/1994 Lui .................... G06F 11/3041
                                                                  702/188
7,840,748 B2    11/2010    Gower et al.

FOREIGN PATENT DOCUMENTS

KR    1020110015217 A    2/2011

* cited by examiner

*Primary Examiner* — Cheng Yuan Tseng
(74) *Attorney, Agent, or Firm* — William Park & Associates Ltd.

(57) ABSTRACT

An electronic system may include a host, a memory, a data recording system, and a driving circuit. The driving circuit may drive a signal transferred between the host and the memory. The driving circuit may maintain amplitude and/or strength of the signal transferred between the host and the memory when the signal is monitored.

15 Claims, 6 Drawing Sheets

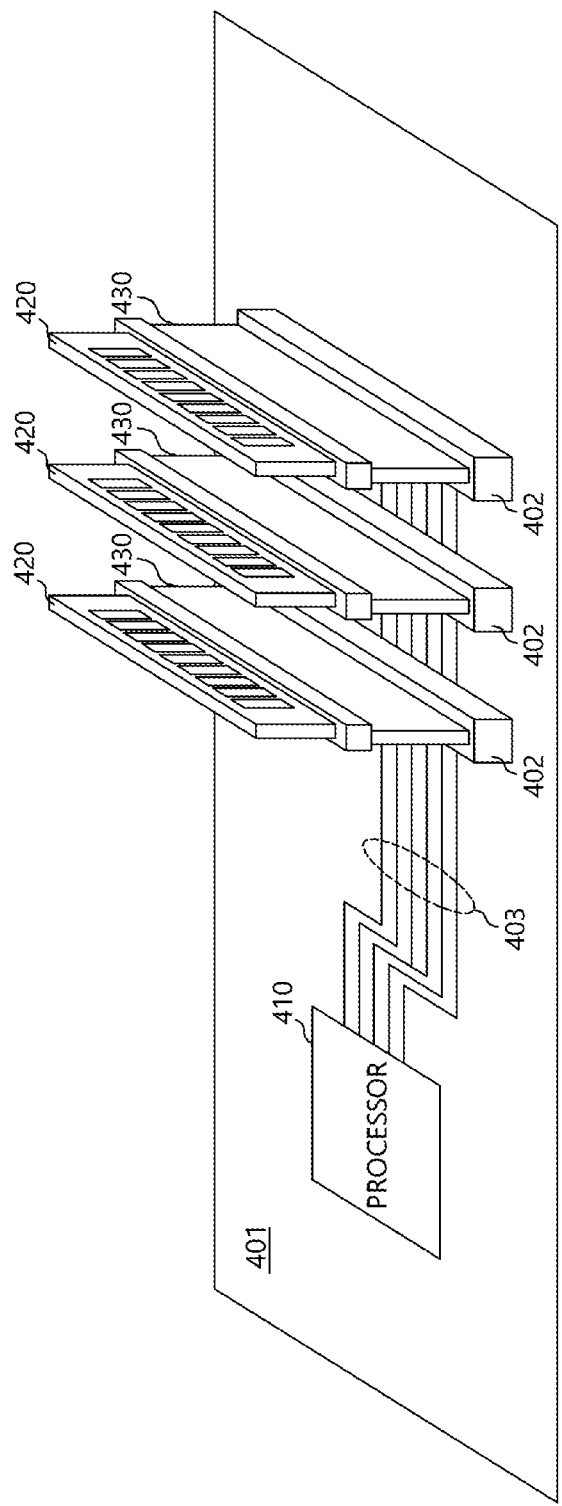

US 10,268,603 B2

ELECTRONIC SYSTEM AND ELECTRONIC DEVICE CAPABLE OF CAPTURING HIGH SPEED SIGNAL

CROSS-REFERENCES TO RELATED APPLICATION

The present application claims priority under 35 U.S.C. § 119(a) to Korean application number 10-2015-0150661 filed on Oct. 29, 2015 in the Korean Intellectual Property Office, which is incorporated herein by reference in its entirety.

BACKGROUND

1. Technical Field

Various embodiments generally relate to an electronic apparatus, and more particularly to an electronic system and electronic device capable of capturing high speed signal.

2. Related Art

In a computer system, a processor and a memory mounted on a mainboard may communicate with each other through signal buses of the mainboard. In recent years, an electronic system or an electronic device in which the processor and the memory are integrated is being applied to personal and portable electronic devices. For example, the processor and the memory may be fabricated on a single chip, or may be enclosed in a single package or module.

The electronic system or the electronic device may include a multi-chip package (MCP), a system on chip (SOC), a system in package (SIP), a package on package (POP), and so forth. The electronic system or the electronic device may be used in personal electronic devices including a personal computer (PC), a tablet PC, a laptop computer, a smartphone, portable multimedia device, and so forth.

SUMMARY

In an embodiment of the present invention, an electronic system may include a host, a memory, a data recording circuit, and a driving circuit. The driving circuit may drive a signal transferred from the host, and provide the driven signal to the memory and the data recording circuit.

In an embodiment of the present invention, an electronic system may include a host, a memory, a data recording circuit, and a driving circuit. The driving circuit may drive a signal transferred from the host and provide the driven signal to the memory and the data recording circuit, and may drive a signal transferred from the memory and provide the driven signal to the host and the data recording circuit.

In an embodiment of the present invention, an electronic system may include a host, a memory, a data recording system, a first driving circuit, and a second driving circuit. The first driving circuit may drive a first signal transferred from the host and provide the driven first signal to the memory and the data recording system. The second driving circuit may drive a second signal transferred from the host and provide the driven second signal to the memory and the data recording circuit, and may drive the second signal transferred from the memory and provide the driven second signal to the host and the data recording circuit.

In an embodiment of the present invention, an electronic device may include a processor, a signal capture board, and a memory. The memory may be mounted on the signal capture board. The signal capture board may include a first driving circuit and a second driving circuit. The first driving circuit may drive a first signal transferred from the processor and provide the driven first signal to the memory and a monitoring terminal. The second driving circuit may drive a second signal transferred from the processor and provide the driven second signal to the memory and the monitoring terminal, and may drive the second signal transferred from the memory and provide the driven second signal to the processor and the monitoring terminal.

In an embodiment of the present invention, an electronic device may include a mainboard, a processor mounted on the mainboard, a signal capture board mounted on the mainboard, and a memory module mounted on the signal capture board. The signal capture board may include a first driving circuit and a second driving circuit. The first driving circuit may drive a first signal transferred from the processor and provide the driven first signal to the memory module and a monitoring terminal. The second driving circuit may drive a second signal transferred from the processor and provide the driven second signal to the memory module and the monitoring terminal, and may drive the second signal transferred from the memory module and provide the driven second signal to the processor and the monitoring terminal.

In an embodiment of the present invention, an electronic device may include a processor, a signal capture board mounted on the processor, and a memory mounted on the signal capture board. The signal capture board may include a first driving circuit and a second driving circuit. The first driving circuit may drive a first signal transferred from the processor and provide the driven first signal to the memory and a monitoring terminal. The second driving circuit may drive a second signal transferred from the processor and to provide the driven second signal to the memory and the monitoring terminal, and may drive the second signal transferred from the memory and to provide the driven second signal to the processor and the monitoring terminal.

BRIEF DESCRIPTION OF THE DRAWINGS

FIGS. 4 and 5 are diagrams illustrating an example of an electronic device in accordance with an embodiment of the present disclosure.

DETAILED DESCRIPTION

Hereinafter, a semiconductor apparatus according to embodiments of the present invention will be described below with reference to the accompanying drawings.

Figure 1:
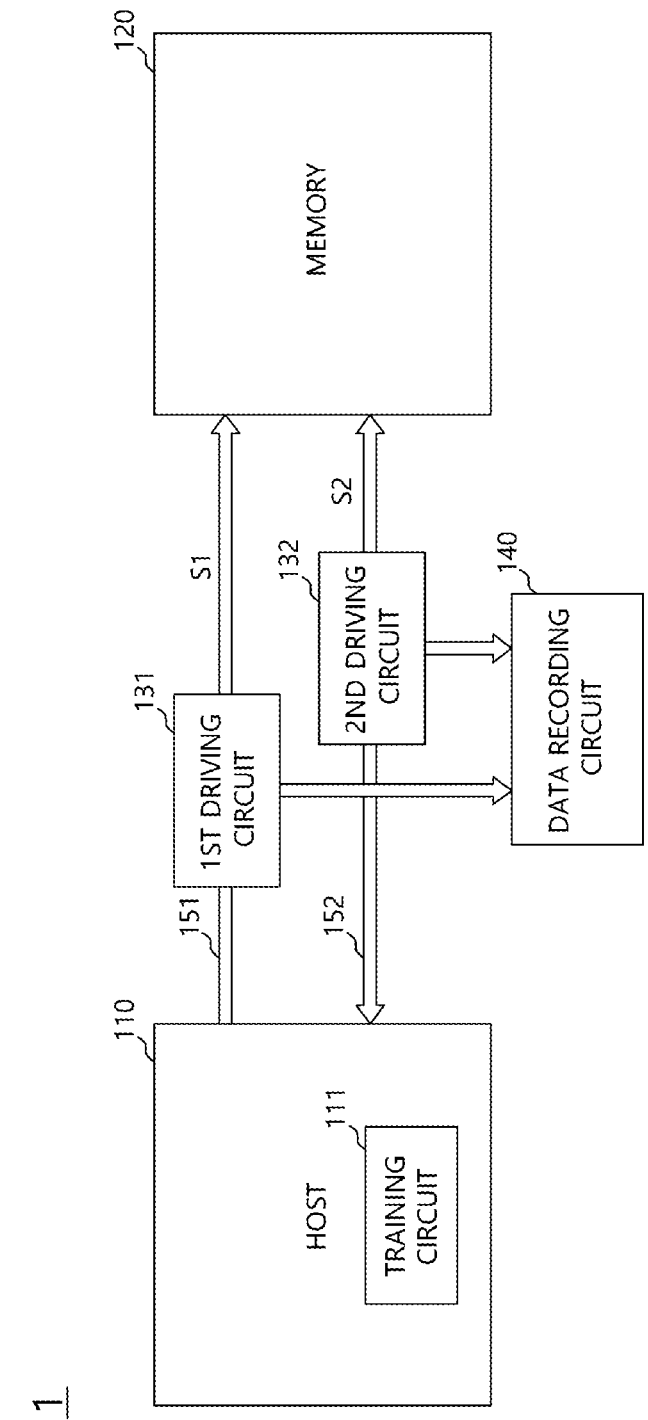
FIG. 1 is a diagram illustrating an example of an electronic system in accordance with an embodiment of the present disclosure.

FIG. 1 is a diagram illustrating an example of an electronic system 1 in accordance with an embodiment of the present disclosure. Referring to FIG. 1, the electronic system 1 may include a host 110, a memory 120, a plurality of driving circuits 131 and 132, and a data recording circuit 140. The host 110 and the memory 120 may perform data communication. The host 110 may include one or more of a central processing unit (CPU), a graphic processing unit (GPU), a multi-media processor (MMP), and a digital signal processor. The host 110 may be implemented in a form of the system on chip (SoC) by combining processor chips having various functions such as an application processor (AP). The memory 120 may include a volatile memory device and a non-volatile memory. Examples of the volatile memory may include a static RAM (SRAM), a dynamic RAM (DARM), and a synchronous DRAM (SDRAM). Examples of the non-volatile memory may include a read only memory (ROM), a programmable ROM (PROM), an electrically erasable programmable ROM (EEPROM), an electrically programmable ROM (EPROM), a flash memory, a phase change RAM (PRAM), a magnetic RAM (MRAM), a resistive RAM (RRAM), and a ferroelectric RAM (FRAM).

The host 110 and the memory 120 may be electrically coupled to each other through a plurality of buses. FIG. 1 illustrates first and second buses 151 and 152 as examples of the plurality of buses coupling the host 110 to the memory 120. The first bus may transfer a first signal S1 and the second bus may transfer a second signal S2. The first signal S1 may be provided from the host 110 to the memory 120. For example, the first signal S1 may include one or more of a command signal, an address signal, a clock signal, and a request signal. The second signal S2 may be provided from the host 110 to the memory 120, or may be provided from the memory 120 to the host 110. For example, the second signal S2 may include one or both of a data signal and a data strobe signal.

The plurality of driving circuits 131 and 132 may include a first driving circuit 131 and a second driving circuit 132. The first driving circuit 131 may be electrically coupled to the first bus 151, and the second driving circuit 132 may be electrically coupled to the second bus 152. The first driving circuit 131 may drive a signal transferred from the host 110, and provide the driven signal to the memory 120 and the data recording circuit 140. For example, the first driving circuit 131 may drive the first signal S1, and provide the driven signal to the memory 120 and the data recording circuit 140. The second driving circuit 132 may drive a signal transferred from the host 110, and provide the driven signal to the memory 120 and the data recording circuit 140. The second driving circuit 132 may drive the second signal S2 provided from the host 110, and provide the driven signal to the memory 120 and the data recording circuit 140. The second driving circuit 132 may drive a signal transferred from the host 110, and provide the driven signal to the memory 120 and the data recording circuit 140. The second driving circuit 132 may drive a signal transferred from the memory 120, and provide the driven signal to the host 110 and the data recording circuit 140. The second driving circuit 132 may drive the second signal S2 provided from the host 110, and provide the driven signal to the memory 120 and the data recording circuit 140. The second driving circuit 132 may drive the second signal S2 provided from the memory 120, and provide the driven signal to the host 110 and the data recording circuit 140.

The host 110 and the memory 120 may communicate with one another via a high speed interface. Therefore, the first and second signals S1 and S2 transferred through the first and second buses 151 and 152 may have high frequencies and low amplitudes. The first and second driving circuits 131 and 132 may drive the first and second signals S1 and S2 transferred through the first and second buses 151 and 152, and provide the driven signals not only to the host 110 and the memory 120 but also to the data recording circuit 140. Therefore, the first and second signals S1 and S2 transferred between the host 110 and the memory 120 may be monitored. In an embodiment, the amplitude and/or strength of the first and second signals S1 and S2 transferred between the host 110 and the memory 120 may be maintained when the signal is monitored.

The data recording circuit 140 may store and monitor the signals transferred between the host 110 and the memory 120. The data recording circuit 140 may monitor the first and second signals S1 and S2 transferred between the host 110 and the memory 120 by receiving the signal provided from the first and second driving circuits 131 and 132. For example, the data recording circuit 140 may include a data storage area such as a small outline dual in-line memory module (SODIMM) and a programmable logic device such as a field programmable gate array (FPGA). The data recording circuit 140 may store the signal outputted from the first and second driving circuits 131 and 132 in the data storage area such as the SODIMM and the FPGA. The data recording circuit 140 may monitor and/or analyze the signal transferred between the host 110 and the memory 120 by reading the signal from the SODIMM and performing arithmetic operation.

Referring to FIG. 1, the host 110 may further include a training circuit 111. The training circuit 111 may compensate for delay time caused by the first and second driving circuits 131 and 132. The first and second driving circuits 131 and 132 electrically coupled between the host 110 and the memory 120 may delay the first and second signals S1 and S2 transferred through the first and second buses 151 and 152. Therefore, the training circuit 111 may perform a training operation for the host 110 and the memory 120. For example, the training circuit 111 may perform a timing training with respect to the second signal S2 provided from the memory 120 through the second bus 152.

Figure 2:
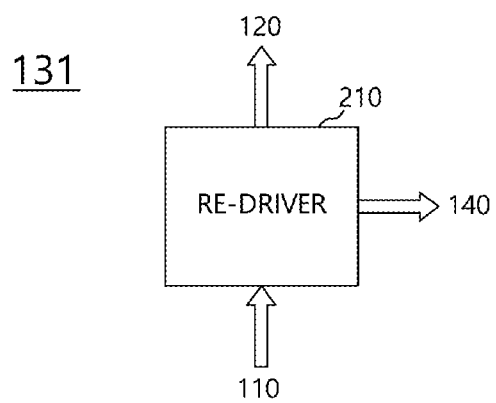
FIG. 2 is a diagram illustrating an example of a first driving circuit illustrated in FIG. 1.

FIG. 2 is a diagram illustrating an example of the first driving circuit 131 shown in FIG. 1. Referring to FIG. 2, the first driving circuit 131 may include a re-driver 210. The re-driver 210 may drive the signal transferred from the host 110, and provide the driven signal to the memory 120 and the data recording circuit 140. The re-driver 210 may be a one-way repeater and a one-input-two-output repeater. For example, the re-driver 210 may be implemented in a register clock driver (RCD), which may be used for a registered dual in-line memory module (RDIMM) or a load reduced dual in-line memory module (LRDIMM). The re-driver 210 may be fabricated as an application specific integrated circuit (ASIC).

Figure 3A:
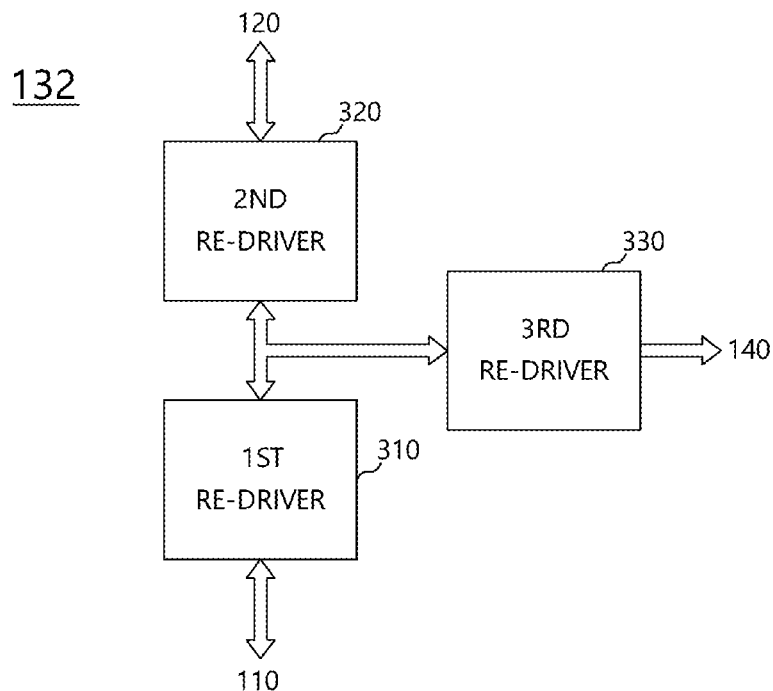
FIGS. 3A and 3B are diagrams illustrating examples of a second driving circuit illustrated in FIG. 1.
Figure 3B:
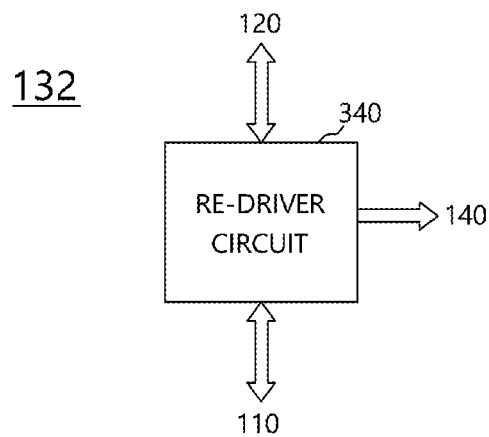

FIGS. 3A and 3B are diagrams illustrating examples of the second driving circuit 132 illustrated in FIG. 1. Referring to FIG. 3A, the second driving circuit 132 may include a first re-driver 310, a second re-driver 320, and a third re-driver 330. The first re-driver 310 may be electrically coupled between the host 110 and the second and third re-drivers 320 and 330. For example, the first re-driver 310 may be electrically coupled between the host 110 and the second re-driver 320 and between the host 110 and the third re-driver 330. The second re-driver 320 may be electrically coupled between the memory 120 and the first and third re-drivers 310 and 330. For example, the second re-driver 320 may be electrically coupled between the memory 120 and the first re-driver 310 and between the memory 120 and the third re-driver 330. The third re-driver 330 may be electrically coupled between the first and second re-drivers 310 and 320 and the data recording circuit 140. For example, the third re-driver 330 may be electrically coupled between the first re-driver 310 and the data recording circuit 140 and between the second re-driver 320 and the data recording circuit 140. The first re-driver 310 may drive the signal transferred from the host 110, and provide the driven signal to the second re-driver 320 and the third re-driver 330. Also, the first re-driver 310 may drive the signal provided from the second re-driver 320, and provide the driven signal to the host 110. The second re-driver 320 may drive the signal transferred from the memory 120, and provide the driven signal to the first re-driver 310 and the third re-driver 330. Also, the second re-driver 320 may drive the signal provided from the first re-driver 310, and provide the driven signal to the memory 120. Each of the first and second re-drivers 310 and 320 may be the two-way repeater. The third re-driver 330 may be the one-way repeater. Referring to FIG. 3B, the second driving circuit 132 may include a re-driver circuit 340. The re-driver circuit 340 may be fabricated as the application specific integrated circuit (ASIC) coupled between the host 110, the memory 120, and the data recording circuit 140.

Figure 5:
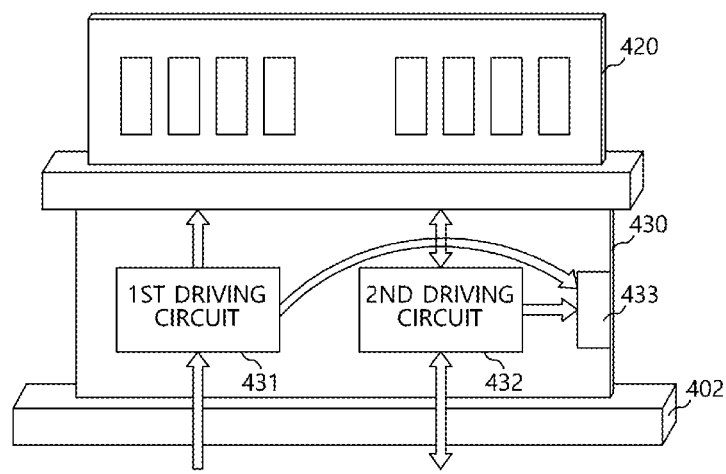

FIGS. 4 and 5 are diagrams illustrating an example of an electronic device in accordance with an embodiment of the present disclosure. The electronic device may be a computing device. The electronic device may include a mainboard 401, a processor 410, a memory module 420, and a signal capture board 430. The mainboard 401 may be a substrate on which components of the electronic device are mounted, and may be referred to as a mother board. The mainboard 401 may include a slot (not illustrated) for mounting the processor 410, and a slot 402 for mounting the memory module 420. The mainboard 401 may include electric wires electrically coupling the processor 410 to the memory module 420. The processor 410 may be mounted on the mainboard 401. For example, the memory module 420 may include the dual in-line memory module (DIMM), the unRegistered DIMM (UDIMM), the registered DIMM (RDIMM), the load reduced DIMM (LRDIMM), the small outline DIMM (SODIMM), and so forth.

In general, the memory module 420 may be installed into the slot 402 of the mainboard 401. In an embodiment, instead of the memory module 420, the signal capture board 430 may be installed into the slot 402 of the mainboard 401. Also, the memory module 420 may be mounted on the signal capture board 430. The memory module 420 may include a male connector at a bottom end thereof. The signal capture board 430 may include a male connector at a bottom end thereof, and may be mounted on the mainboard 401 by inserting the male connector of the signal capture board 430 into the slot 402 of the mainboard 401. The signal capture board 430 may include a female connector at a top end thereof, and the memory module 420 may be mounted on the signal capture board 430 by inserting the male connector of the memory module 420 into the female connector of the signal capture board 430. Therefore, the signal capture board 430 may be electrically coupled between the processor 410 and the memory module 420.

The signal capture board 430 may include a first driving circuit 431, a second driving circuit 432, and a monitoring terminal 433. The first driving circuit 431 may drive a signal transferred from the processor 410, and provide the driven signal to the memory module 420 and the monitoring terminal 433. The second driving circuit 432 may drive the signal transferred from the processor 410, and provide the driven signal to the memory module 420 and the monitoring terminal 433. The second driving circuit 432 may drive a signal transferred from the memory module 420, and provide the driven signal to the processor 410 and the monitoring terminal 433. Although not illustrated, in an embodiment, the monitoring terminal 433 may be electrically coupled to a data recording circuit through a cable.

In the electronic device, the signal capture board 430 may be electrically coupled between the processor 410 and the memory module 420, and monitor the signal transferred between the processor 410 and the memory module 420. The first and second driving circuits 431 and 432 may drive the signal transferred from the processor 410 to the memory module 420 and the signal transferred from the memory module 420 to the processor 410, and thus may be able to monitor the signals. In an embodiment, the amplitude and/or strength of the signal transferred between the processor 410 and the memory module 420 may be maintained when the signal is monitored. In an embodiment, the processor 410 may include a training circuit (not illustrated). The training circuit may perform a training operation (e.g., signal timing training) for the processor 410 and the memory module 420 in order to compensate for delay time caused by the first and second driving circuits 431 and 432.

Figure 6:
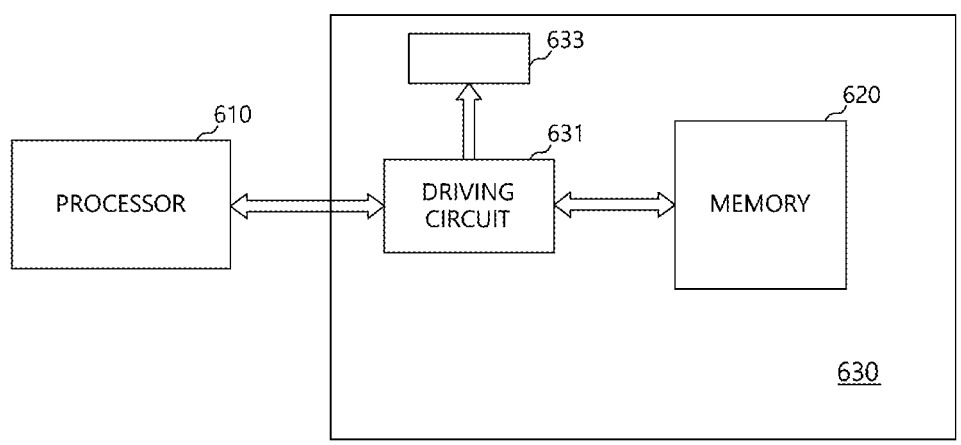
FIG. 6 is a diagram illustrating an example of an electronic device in accordance with an embodiment of the present disclosure.

FIG. 6 is a diagram illustrating an example of an electronic device in accordance with an embodiment of the present disclosure. Referring to FIG. 6, the electronic device may include a mainboard 601, a processor 610, a memory 620, and a signal capture board 630. The processor 610 may be electrically coupled to the memory 620. In an embodiment, the signal capture board 630 may be electrically coupled to the processor 610, and the memory 620 may be mounted on the signal capture board 630. The memory 620 may be electrically coupled to the processor 610 through the signal capture board 630. The signal capture board 630 may include a driving circuit 631 and a slot for installing the memory 620. The driving circuit 631 may include one or more of the driving circuits described with reference to FIGS. 1 to 5. The driving circuit 631 may drive a signal transferred from the processor 610 to the memory 620, and provide the driven signal to the memory 620 and the monitoring terminal 633. The driving circuit 631 may drive a signal transferred from the memory 620 to the processor 610, and provide the driven signal to the processor 610 and the monitoring terminal 633. For example, the monitoring terminal 633 may be electrically coupled to a data recording circuit through a cable. In an embodiment, the processor 610 may include a training circuit (not illustrated). The training circuit may compensate for delay time caused by the driving circuit 633.

Figure 7A:
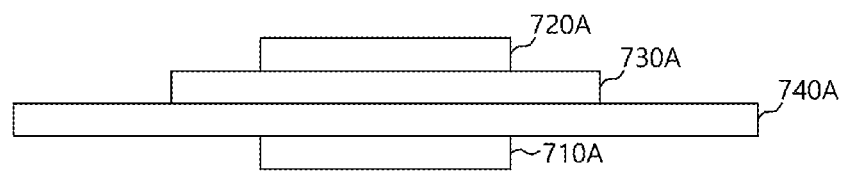
FIGS. 7A and 7B are diagrams illustrating an example of an electronic device in accordance with an embodiment of the present disclosure.
Figure 7B:
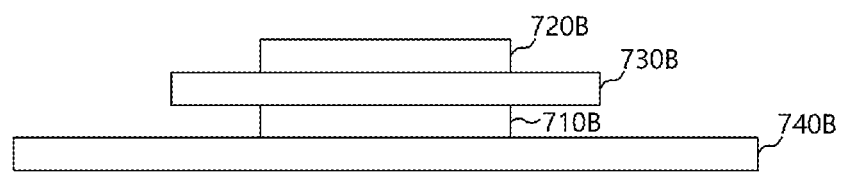

FIGS. 7A and 7B are diagrams illustrating an example of an electronic device in accordance with an embodiment of the present disclosure. The electronic device may be a mobile electronic device. Referring to FIG. 7A, the electronic device may include a processor 710A, a memory module 720A, a signal capture board 730A, and a substrate 740A. The processor 710A may be an application processor (AP). For example, the memory module 720A may be mounted on one side of the substrate 740A, and the processor 710A may be mounted on the other side of the substrate 740A. In an embodiment, the signal capture board 730A may be mounted on one side of the substrate 740A, and the memory module 720A may be mounted on the signal capture board 730A, which is mounted on the other side of the substrate 740A. The signal capture board 730A may include a slot for installing the memory module 720A. The signal capture board 730A may include the driving circuits and the monitoring terminal described with reference to FIGS. 1 to 6. The driving circuit may drive a signal transferred from the processor 710A to the processor 710A, and provide the driven signal to the memory module 720A and the monitoring terminal. The driving circuit may drive a signal transferred from the memory module 720A to the processor 710A, and provide the driven signal to the processor 710A and the monitoring terminal.

The configuration example illustrated in FIG. 7B is different from FIG. 7A. Referring to FIG. 7B, the electronic device may be fabricated by way of the package on package (POP). Referring to FIG. 7B, the electronic device may include a processor 710B, a memory module 720B, a signal capture board 730B, and a substrate 740B. The processor 710B may be mounted on the substrate 740B. The signal capture board 730B may be mounted on the processor 710B. The memory module 720B may be mounted on the signal capture board 730B. The signal capture board 730B may include the driving circuits and the monitoring terminal described with reference to FIGS. 1 to 6.

While certain embodiments have been described above, it will be understood to those skilled in the art that the embodiments described are by way of example only. Accordingly, the electronic system and electronic device capable of capturing high speed signal should not be limited based on the described embodiments. Rather, the electronic system and electronic device capable of capturing high speed signal described herein should only be limited in light of the claims that follow when taken in conjunction with the above description and accompanying drawings.

What is claimed is:

1. An electronic system comprising:
a host;
a memory;
a data recording circuit; and
a plurality of driving circuits configured to drive a signal transferred, via a plurality of buses, from the host, and to provide the driven signal to the memory and the data recording circuit,
wherein at least one of the buses of the plurality of buses is unidirectional from the host to the memory and at least one of the buses of the plurality of buses is bidirectional.

2. The system of claim 1, wherein the driving circuit includes one or more of a one-way re-driver and a one-input-two-output re-driver configured to drive the signal transferred from the host, and to provide the driven signal to the memory and the data recording circuit.

3. The system of claim 1, wherein the driving circuit is further configured to drive a signal transferred from the memory and to provide the driven signal to the host and the data recording circuit.

4. The system of claim 3, wherein the driving circuit includes:
a first re-driver configured to drive and output the signal transferred from the host;
a second re-driver configured to drive the signal output from the first re-driver and to provide the driven signal to the memory, and to drive and output the signal transferred from the memory; and
a third re-driver configured to drive the signals output from the first and second re-drivers and to provide the driven signals to the data recording circuit.

5. A semiconductor system comprising:
a host;
a memory;
a data recording system;
a first driving circuit, on a first bus, configured to drive a first signal transferred from the host and to provide the driven first signal to the memory and the data recording circuit; and a second driving circuit, on a second bus, configured to drive a second signal transferred from the host and to provide the driven second signal to the memory and the data recording circuit, and to drive the second signal transferred from the memory and to provide the driven second signal to the host and the data recording circuit,
wherein the first bus is unidirectional from the host to the memory and the second bus is bidirectional.

6. The system of claim 5, wherein the first signal includes one or more of a command signal, an address signal, and a clock signal.

7. The system of claim 5, wherein the second signal includes one or more of a data signal and a data strobe signal.

8. The system of claim 5, wherein the first driving circuit includes one or more of a one-way re-driver and a one-input-two-output re-driver configured to drive the first signal transferred from the host, and to provide the driven first signal to the memory and the data recording circuit.

9. The system of claim 5, wherein the second driving circuit includes:
a first re-driver configured to drive and output the second signal transferred from the host;
a second re-driver configured to drive the signal output from the first re-driver and to provide the driven signal to the memory, and to drive and output the second signal transferred from the memory; and
a third re-driver configured to drive the signals output from the first and second re-drivers and to provide the driven signals to the data recording circuit.

10. An electronic device comprising:
a processor;
a signal capture board; and
a memory mounted on the signal capture board,
wherein the signal capture board includes:
a first driving circuit, on a first bus, configured to drive a first signal transferred from the processor and to provide the driven first signal to the memory and a monitoring terminal; and
a second driving circuit, on a second bus, configured to drive a second signal transferred from the processor and to provide the driven second signal to the memory and the monitoring terminal, and to drive the second signal transferred from the memory and to provide the driven second signal to the processor and the monitoring terminal,
wherein the first bus is unidirectional from a host to the memory and the second bus is bidirectional.

11. The electronic device of claim 10, wherein the first signal includes one or more of a command signal, an address signal, and a clock signal.

12. The electronic device of claim 10, wherein the second signal includes one or more of a data signal and a data strobe signal.

13. The electronic device of claim 10, further comprising a data recording circuit electrically coupled to the monitoring terminal through a cable.

14. The electronic device of claim 10, wherein the signal capture board is mounted on the mainboard.

15. The electronic device of claim 10, wherein the signal capture board is mounted on the processor.

* * * * *